United States Patent
Lee et al.

(10) Patent No.: US 9,431,472 B2
(45) Date of Patent: Aug. 30, 2016

(54) ORGANIC LIGHT-EMITTING DIODE (OLED) DISPLAY AND METHOD OF MANUFACTURING THE SAME

(71) Applicant: Samsung Display Co., Ltd., Yongin, Gyeonggi-do (KR)

(72) Inventors: Jungkyu Lee, Yongin (KR); Dohyun Kwon, Yongin (KR); Taehyun Kim, Yongin (KR); Donghwan Shim, Yongin (KR); Minjung Lee, Yongin (KR); Seunghwan Cho, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/599,241

(22) Filed: Jan. 16, 2015

(65) Prior Publication Data

US 2016/0056225 A1 Feb. 25, 2016

(30) Foreign Application Priority Data

Aug. 19, 2014 (KR) ........................ 10-2014-0107757

(51) Int. Cl.
*H01L 27/32* (2006.01)
*H01L 51/56* (2006.01)
*H01L 51/00* (2006.01)

(52) U.S. Cl.
CPC ....... *H01L 27/3279* (2013.01); *H01L 27/3258* (2013.01); *H01L 27/3262* (2013.01); *H01L 27/3265* (2013.01); *H01L 51/0023* (2013.01); *H01L 51/56* (2013.01); *H01L 2227/323* (2013.01)

(58) Field of Classification Search
CPC ........... H01L 27/3262; H01L 27/3265; H01L 27/3276; H01L 27/3248; H01L 51/5203; H01L 27/124; H01L 51/52

USPC .................................................. 313/498–512
See application file for complete search history.

(56) References Cited

U.S. PATENT DOCUMENTS

| | | | |
|---|---|---|---|
| 2007/0166859 A1 | 7/2007 | Lee et al. | |
| 2011/0012116 A1* | 1/2011 | Yamazaki | H01L 27/1225 257/59 |
| 2011/0014745 A1* | 1/2011 | Miyanaga | H01L 27/1225 438/104 |
| 2012/0009691 A1 | 1/2012 | Chung | |
| 2014/0034923 A1 | 2/2014 | Kim et al. | |
| 2014/0353629 A1* | 12/2014 | Jin | H01L 27/3262 257/40 |

(Continued)

FOREIGN PATENT DOCUMENTS

KR 10-2006-0064262 A 6/2006
KR 10-2007-0038193 A 4/2007

(Continued)

*Primary Examiner* — Donald Raleigh
*Assistant Examiner* — Kevin Quarterman
(74) *Attorney, Agent, or Firm* — Knobbe, Martens, Olson & Bear, LLP

(57) ABSTRACT

An organic light-emitting diode (OLED) display and a method of manufacturing the same are disclosed. In one aspect, the OLED display includes a plurality of pixels, each of the pixels including at least one wiring configured to receive an electrical signal and a storage capacitor formed on the same layer as the wiring. The wiring includes a first conductive pattern layer, an intermediate insulation pattern layer, and a second conductive pattern layer that are sequentially stacked. The first and second conductive pattern layers are electrically connected to each other through a first via hole.

10 Claims, 10 Drawing Sheets

(56) References Cited

U.S. PATENT DOCUMENTS

2015/0053965 A1* 2/2015 Lee .................... H01L 27/1218
257/43
2015/0137099 A1* 5/2015 Choi .................... G09G 3/3258
257/40

FOREIGN PATENT DOCUMENTS

| KR | 10-2007-0070382 A | 7/2007 |
| KR | 10-2014-0018623 A | 2/2014 |

* cited by examiner

ORGANIC LIGHT-EMITTING DIODE (OLED) DISPLAY AND METHOD OF MANUFACTURING THE SAME

CROSS-REFERENCE TO RELATED APPLICATIONS

This application claims the benefit of Korean Patent Application No. 10-2014-0107757, filed on Aug. 19, 2014, in the Korean Intellectual Property Office, the disclosure of which is incorporated herein in its entirety by reference.

BACKGROUND

1. Field

The described technology generally relates to organic light-emitting diode (OLED) displays and methods of manufacturing the same.

2. Description of the Related Technology

An OLED display includes a plurality of OLEDs, each including a hole injection electrode, an electron injection electrode, and an organic emission layer formed between the hole and electron injection electrodes. OLED display are self-emissive display devices that emit light when excitons, which are generated when holes injected into the hole injection electrode and electrons injected into the electron injection electrode combine with each other and fall from an excited state to a ground state.

Since OLED displays are self-emissive, they do not require an additional light source and thus can be operated at low voltages and can be manufactured to have a thin profile and to be light-weight. Additionally, due to the high-quality characteristics of these displays such as wide viewing angles, high contrast, and quick response speeds, OLED displays are regarded as next-generation display devices.

SUMMARY OF CERTAIN INVENTIVE ASPECTS

One inventive aspect is an OLED display in which a low-resistance wiring is arranged and a capacity of a storage capacity is easily secured, and a method of manufacturing the OLED display.

Additional aspects will be set forth in part in the description which follows and, in part, will be apparent from the description, or may be learned by practice of the presented embodiments.

Another aspect is an OLED display including a plurality of pixels, wherein each of the pixels includes: a wiring through which an electrical signal is transmitted; and a storage capacitor formed on the same layer as the wiring, wherein the wiring includes a first conductive pattern layer, an intermediate insulation pattern layer, and a second conductive pattern layer that are sequentially stacked, and the first conductive pattern layer and the second conductive pattern layer are connected to each other through a first via hole.

The OLED display may further include a planarization layer that covers the wiring and the storage capacitor, wherein the planarization layer includes a second via hole formed at a position corresponding to the first via hole, and a contact metal is included in the first via hole and the second via hole.

The OLED display may further include an OLED that is formed on the planarization layer and includes a pixel electrode, an intermediate layer, and an opposite electrode that are sequentially stacked, wherein the contact metal is formed of the same material as that of the pixel electrode.

The contact metal may extend from the first via hole and the second via hole to be formed on the planarization layer.

The width of the second via hole may be greater than the width of the first via hole.

The first via hole may expose an upper surface of the first conductive pattern layer.

The storage capacitor may include a first electrode, an intermediate dielectric layer, and a second electrode that are sequentially stacked, wherein the first electrode, the intermediate dielectric layer, and the second electrode are respectively formed on the same layer as and of the same materials as those of the first conductive pattern layer, the intermediate insulation pattern layer, and the second conductive pattern layer.

The OLED display may further include: a driving thin film transistor that is formed below the storage capacitor and is connected to the storage capacitor through a contact hole; and an interlayer insulation layer that is interposed between the driving thin film transistor and the storage capacitor, wherein the storage capacitor overlaps the driving thin film transistor.

The driving thin film transistor may include: a driving semiconductor layer formed on a substrate; a gate insulation layer covering the driving semiconductor layer; and a driving gate electrode that is formed on the gate insulation layer, wherein at least a portion of the driving gate electrode overlaps the driving semiconductor layer.

A plurality of wirings are included, and the wirings include a driving voltage line through which a driving voltage is transmitted and a data line through which a data signal is transmitted, wherein the OLED display further includes: a planarization layer that covers the driving voltage line, the data line, and the storage capacitor; and a bridge metal that is formed on the planarization layer and connects the driving voltage line and the storage capacitor.

Another aspect is a method of manufacturing an OLED display including a plurality of pixels, including: forming a wiring in which a first conductive pattern layer, an intermediate insulation pattern layer, and a second conductive pattern layer that are sequentially stacked, wherein the first conductive pattern layer and the second conductive pattern layer are connected to each other through a first via hole; and forming a storage capacitor that is formed on the same layer as the wiring, wherein the storage capacitor includes a first electrode, an intermediate dielectric layer, and a second electrode that are sequentially stacked, wherein the forming of a wiring and the forming of a storage capacitor are performed in the same operation.

The wiring and the storage capacitor may be formed by: sequentially depositing a first conductive layer, an intermediate insulation layer, and a second conductive layer; and patterning the first conductive layer, the intermediate insulation layer, and the second conductive layer at the same time by using a half-tone mask operation.

The method may further include forming a planarization layer that covers the wiring and the storage capacitor, wherein the planarization layer includes a second via hole formed at a position corresponding to the first via hole, and a contact metal is included in the first via hole and the second via hole.

The method may further include forming an OLED that is formed on the planarization layer and in which a pixel electrode, an intermediate layer, and an opposite electrode that are sequentially stacked, wherein the contact metal is simultaneously formed with the pixel electrode.

Each of the pixels may include: a driving thin film transistor that is formed under the storage capacitor and is connected to the storage capacitor through a contact hole; and an interlayer insulation layer formed between the driving thin film transistor and the storage capacitor, wherein the storage capacitor overlaps the driving thin film transistor.

Another aspect is an organic light-emitting diode (OLED) display comprising a plurality of pixels, wherein each of the pixels comprises at least one wiring configured to receive an electrical signal; and a storage capacitor formed on the same layer as the wiring, wherein the wiring comprises a first conductive pattern layer, an intermediate insulation pattern layer, and a second conductive pattern layer that are sequentially stacked, and wherein the first and second conductive pattern layers are electrically connected to each other through a first via hole.

In certain embodiments, each of the pixels further comprises a planarization layer covering the wiring and the storage capacitor, wherein a second via hole is formed in the planarization layer at a position corresponding to the first via hole; and a contact metal formed in the first and second via holes. Each of the pixels can further comprise an OLED formed over the planarization layer and comprising: i) a pixel electrode, ii) an intermediate layer, and iii) an opposite electrode that are sequentially stacked, wherein the contact metal and the pixel electrode are formed of the same material. The contact metal can extend from the first via hole to the second via hole and is formed over the planarization layer. The width of the second via hole can be greater than the width of the first via hole. The first via hole can expose an upper surface of the first conductive pattern layer.

In certain embodiments, each of the storage capacitors comprises a first electrode, an intermediate dielectric layer, and a second electrode that are sequentially stacked, wherein the first electrode, the intermediate dielectric layer, and the second electrode are respectively formed on the same layers as and of the same materials as those of the first conductive pattern layer, the intermediate insulation pattern layer, and the second conductive pattern layer. Each of the pixels can further comprise a driving thin film transistor formed below the storage capacitor and electrically connected to the storage capacitor through a contact hole; and an interlayer insulation layer interposed between the driving thin film transistor and the storage capacitor, wherein the storage capacitor overlaps the driving thin film transistor.

In certain embodiments, each of the driving thin film transistors comprises a driving semiconductor layer formed over a substrate; a gate insulation layer covering the driving semiconductor layer; and a driving gate electrode formed over the gate insulation layer, wherein at least a portion of the driving gate electrode overlaps the driving semiconductor layer. The at least one wiring can comprise a driving voltage line configured to receive a driving voltage; and a data line configured to receive a data signal, wherein each of the pixels further comprises: a planarization layer coving the driving voltage line, the data line, and the storage capacitor; and a bridge metal formed over the planarization layer and electrically connecting the driving voltage line to the storage capacitor.

Another aspect is a method of manufacturing an organic light-emitting diode (OLED) display comprising a plurality of pixels, the method comprising forming a wiring including a first conductive pattern layer, an intermediate insulation pattern layer, and a second conductive pattern layer that are sequentially stacked, wherein the first and second conductive pattern layers are electrically connected to each other through a first via hole; and forming a storage capacitor on the same layer as the wiring, wherein the storage capacitor includes a first electrode, an intermediate dielectric layer, and a second electrode that are sequentially stacked, wherein the forming of the wiring and the forming of the storage capacitor are performed in the same operation.

In certain embodiments, the forming of the wiring and the forming of the storage capacitor comprise sequentially depositing a first conductive layer, an intermediate insulation layer, and a second conductive layer; and patterning the first conductive layer, the intermediate insulation layer, and the second conductive layer at substantially the same time using a half-tone mask. The method can further comprise forming a planarization layer that covers the wiring and the storage capacitor; forming a second via hole in the planarization layer at a position corresponding to the first via hole; and forming a contact metal in the first via hole and the second via hole.

In certain embodiments, the method further comprises forming an OLED over the planarization layer, the OLED including a pixel electrode, an intermediate layer, and an opposite electrode that are sequentially stacked, wherein the contact metal is substantially simultaneously formed with the pixel electrode. The method can further comprise forming each of the pixels, wherein the forming each of the pixels comprises forming a driving thin film transistor below the storage capacitor, wherein the driving thin film transistor is electrically connected to the storage capacitor through a contact hole; and forming an interlayer insulation layer interposed between the driving thin film transistor and the storage capacitor, wherein the storage capacitor overlaps the driving thin film transistor.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION OF CERTAIN INVENTIVE EMBODIMENTS

Figure 1:
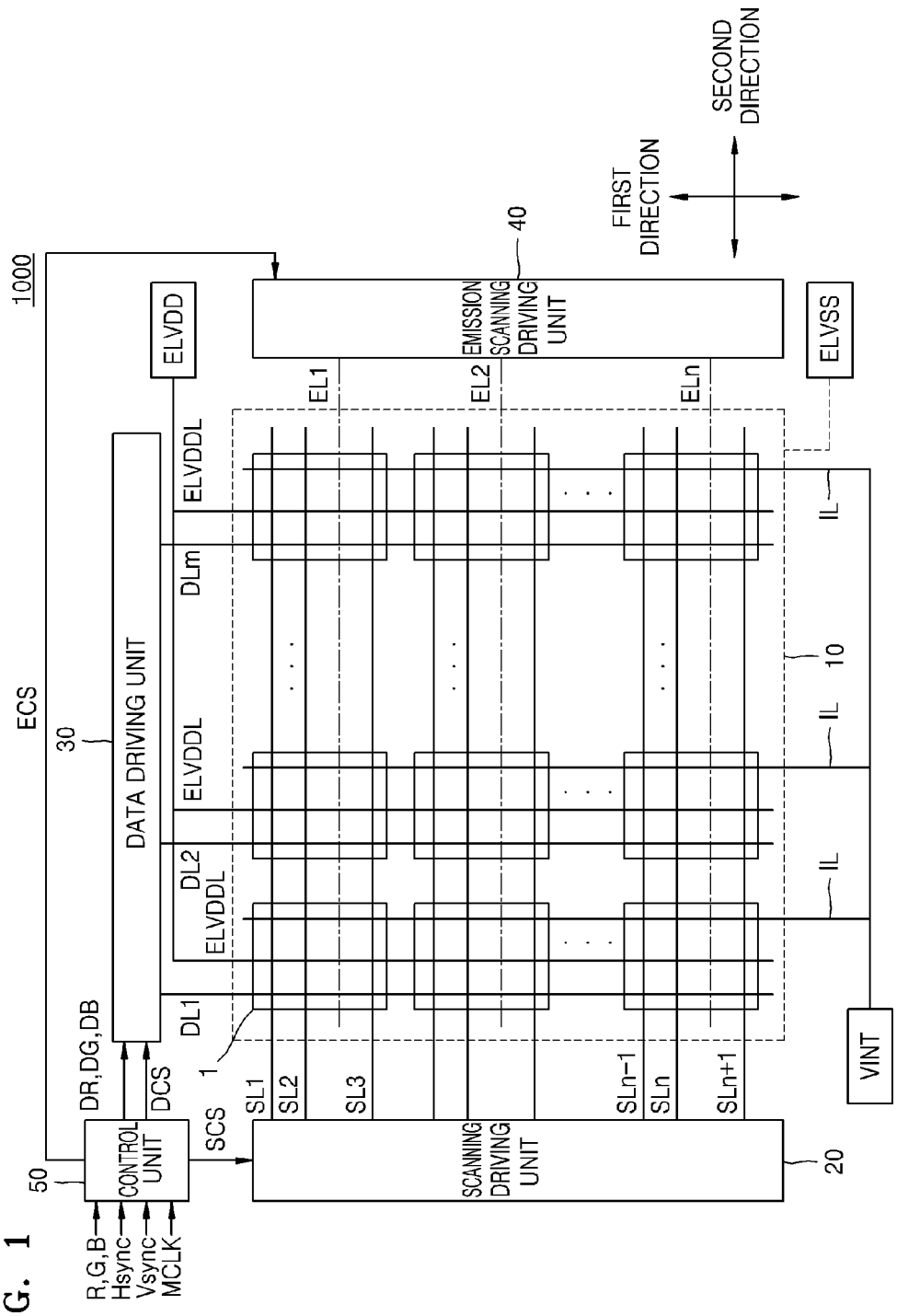
FIG. 1 is a schematic block diagram illustrating an OLED display according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Since the described technology may have various modifications and several embodiments, exemplary embodiments are shown in the drawings and will be described in detail. Advantages, features, and a method of achieving the same will be specified with reference to the embodiments described below in detail together with the attached drawings. However, the embodiments may have different forms and should not be construed as being limited to the descriptions set forth herein.

The embodiments will be described below in more detail with reference to the accompanying drawings. Those components that are the same or are in correspondence are given the same reference numeral regardless of the figure number, and redundant explanations are omitted.

It will be understood that although the terms "first", "second", etc. may be used herein to describe various components, these components should not be limited by these terms. These terms are only used to distinguish one component from another.

Singular expressions, unless defined otherwise in contexts, include plural expressions.

In the embodiments below, it will be further understood that the terms "comprise" and/or "have" as used herein specify the presence of stated features or components, but do not preclude the presence or addition of one or more other features or components.

In the embodiments below, it will be understood when a portion of a layer, an area, or an element is referred to as being "on" or "above" another portion, it can be directly on or above the other portion, or an intervening portion may also be present.

Also, in the drawings, for convenience of description, the sizes of elements may be exaggerated or contracted for the sake of clarity. In other words, since the sizes and thicknesses of components in the drawings may be exaggerated for convenience of explanation, the following embodiments are not limited thereto.

When an embodiment is implementable in another manner, a predetermined process order may be different from the described order. For example, two processes that are consecutively described may be substantially simultaneously performed or may be performed in an opposite order to the described order.

FIG. 1 is a schematic block diagram illustrating an OLED display 1000 according to an embodiment.

The OLED display 1000 includes a display unit or display panel 10 including a plurality of pixels 1, a scanning driving unit or scan driver 20, a data driving unit or data driver 30, an emission control driving unit or emission controller 40, and a control unit or controller 50.

The display unit 10 includes the pixels 1 that are arranged at the intersections between a plurality of scanning lines or scan lines SL1 through SLn+1, a plurality of data lines DL1 through DLm, and a plurality of emission control lines EL1 through ELn and are arranged in a matrix. The scanning lines SL1 through SLn+1 and the emission control lines EL1 through ELn extend in a second direction which is a row direction and the data lines DL1 through DLm and a driving voltage line ELVDDL extend in a first direction which is a column direction. The value, n, of the scanning lines SL1 through SLn+1 in a pixel line may be different from the value, n, of the emission control lines EL1 through ELn.

Each of the pixels 1 is connected to three of the scanning lines SL1 through SLn+1 that are extend to the display unit 10. The scanning driving unit 20 generates three scanning signals and transmits the signals to each pixel 1 through the scanning lines SL1 through SLn+1. That is, the scanning driving unit 20 sequentially supplies a scanning signal to a first scanning line SL2 through SLn, a second scanning line SL1 through SLn−1 or a third scanning line SL3 through SLn+1.

An initialization voltage line IL may receive an initialization voltage of the display unit 10 from an external power supply VINT.

Also, each of the pixels 1 is connected to one of the data lines DL1 through DLm connected to the display unit 10 and one of the emission control lines EL1 through ELn connected to the display unit 10.

The data driving unit 30 transmits a data signal to each of the pixels 1 via the data lines DL1 through DLm. When a scanning signal is supplied to the first scanning line SL2 through SLn, a data signal is supplied to a pixel 1 that is selected via the scanning signal.

The emission control driving unit 40 generates an emission control signal and transmits the same to each pixel 1 through the emission control lines EL1 through ELn. The emission control signal controls an emission time of the pixel 1. The emission control driving unit 40 may be omitted according to the internal structure of the pixel 1.

The control unit 50 receives a plurality of image signals R, G, and B from the outside and generates a plurality of image data signals DR, DG, and DB and transmits the same to the data driving unit 30. Also, the control unit 50 receives a vertical synchronization signal Vsync, a horizontal synchronization signal Hsync, and a clock signal MCLK to generate control signals to control driving of the scanning driving unit 20, the data driving unit 30, and the emission control driving unit 40. The control unit 50 respectively transmits the control signals to the scanning driving unit 20, the data driving unit 30, and the emission control driving unit 40. That is, the control unit 50 generates a scanning driving control signal SCS that controls the scanning driving unit 20, a data driving control signal DCS that controls the data driving unit 30, and an emission control driving control signal ECS that controls the emission control driving unit 40 and transmits the respective signals to the respective driving units.

Each of the pixels 1 receives a first power voltage ELVDD and a second power voltage ELVSS from outside of the display unit 10. The first power voltage ELVDD may be a predetermined high-level voltage and the second power voltage ELVSS may be lower than the first power voltage ELVDD or may be a ground voltage. The first power voltage ELVDD is supplied to each of the pixels 1 via a driving voltage line ELVDDL.

Each of the plurality of pixels 1 emits light having a predetermined luminance via a driving current that is supplied to an OLED according to a data signal transmitted through the plurality of data lines DL1 through DLm.

Figure 2:
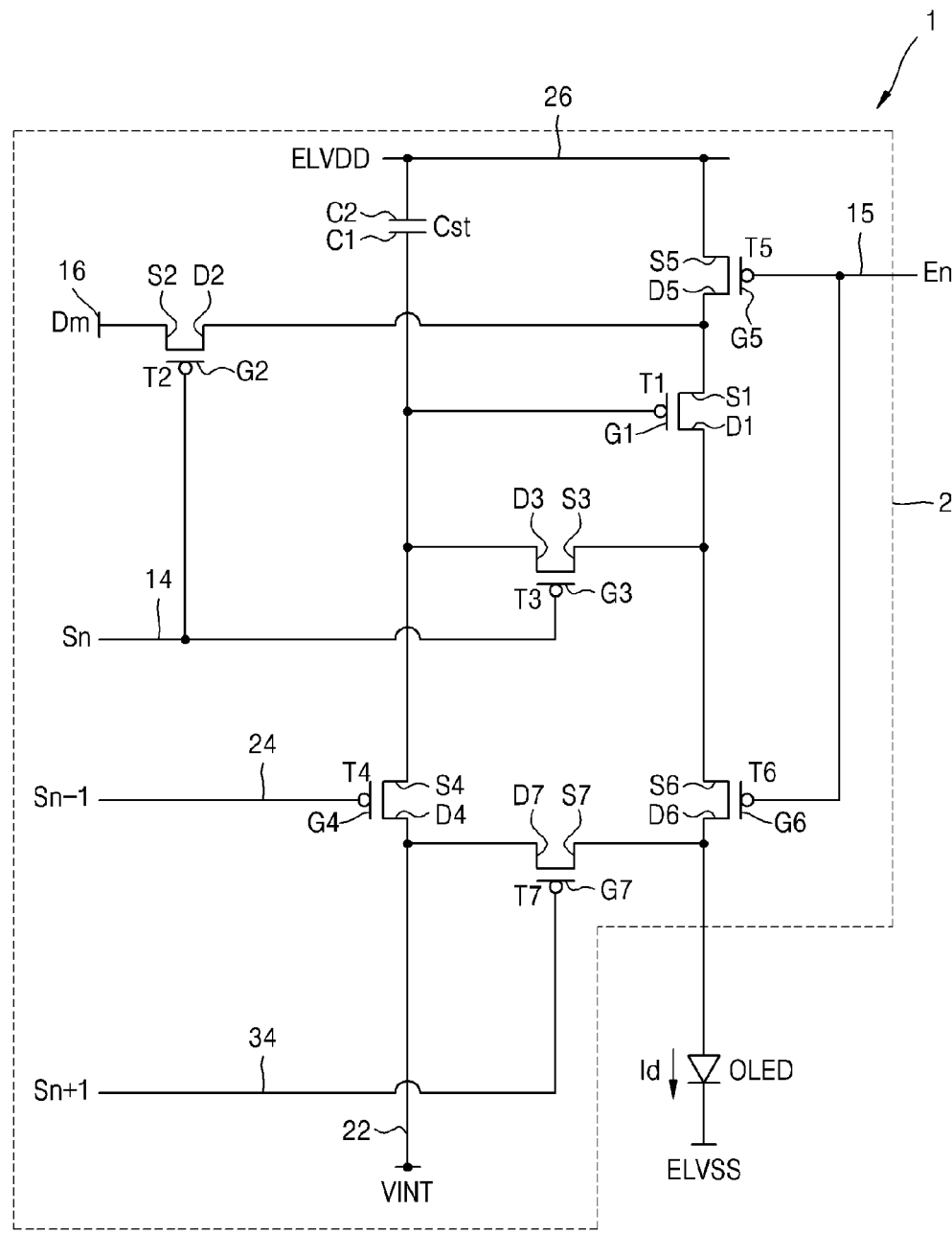
FIG. 2 is an equivalent circuit diagram of a pixel of an OLED display according to an embodiment.

FIG. 2 is an equivalent circuit diagram of a pixel 1 of the OLED display 1000 according to an embodiment.

The pixel 1 of the OLED display 1000 includes a pixel circuit 2 that includes a plurality of thin film transistors T1 through T7 and at least one storage capacitor Cst. The pixel 1 may include an OLED that receives a driving current through the pixel circuit 2 to thereby emit light.

The thin film transistors include a driving thin film transistor T1, a data transmission thin film transistor T2, a compensation thin film transistor T3, a first initialization thin film transistor T4, a first emission control thin film transistor T5, a second emission control thin film transistor T6, and a second initialization thin film transistor T7.

The pixel 1 includes a first scanning line 14 through which a first scanning signal Sn is transmitted to the data transmission thin film transistor T2 and the compensation thin film transistor T3, a second scanning line 24 through which a second scanning signal Sn−1 is transmitted to the first initialization thin film transistor T4, and a third scanning line 34 through which a third scanning signal Sn+1 is transmitted to the second initialization thin film transistor T7. The pixel 1 further includes an emission control line 15 through which an emission control signal En is transmitted to the first emission control thin film transistor T5 and the second emission control thin film transistor T6, a data line 16 through which a data signal Dm is transmitted, a driving voltage line 26 through which a first power voltage ELVDD is transmitted, and an initialization voltage line 22 through which an initialization voltage VINT that initializes the driving thin film transistor T1 is transmitted.

A driving gate electrode G1 of the driving thin film transistor T1 is connected to a first electrode C1 of the storage capacitor Cst. A driving source electrode S1 of the driving thin film transistor T1 is connected to the driving voltage line 26 via the first emission control thin film transistor T5. A driving drain electrode D1 of the driving thin film transistor T1 is electrically connected to a pixel electrode (anode electrode) of the OLED via the second emission control thin film transistor T6. The driving thin film transistor T1 receives a data signal Dm according to a switching operation of the data transmission thin film transistor T2 and supplies a driving current Id to the OLED based on the data signal Dm.

A data transmission gate electrode G2 of the data transmission thin film transistor T2 is connected to the first scanning line 14. A data transmission source electrode S2 of the data transmission thin film transistor T2 is connected to the data line 16. A data transmission drain electrode D2 of the data transmission thin film transistor T2 is connected to the driving source electrode S1 of the driving thin film transistor T1 and is connected to the driving voltage line 26 via the first emission control thin film transistor T5. The data transmission thin film transistor T2 is turned on according to the first scanning signal Sn received through the first scanning line 14 so as to perform a switching operation whereby the data signal Dm received from the data line 16 is transmitted to the driving source electrode S1 of the driving thin film transistor T1.

A compensation gate electrode G3 of the compensation thin film transistor T3 is connected to the first scanning line 14. The compensation gate electrode G3 of the compensation thin film transistor T3 is connected to the driving drain electrode D1 of the driving thin film transistor T1 and is connected to the anode electrode of the OLED via the second emission control thin film transistor T6. The compensation drain electrode D3 of the compensation thin film transistor T3 is also connected to the first electrode C1 of the storage capacitor Cst, the first initialization source electrode S4 of the first initialization thin film transistor T4, and the driving gate electrode G1 of the driving thin film transistor T1. The compensation thin film transistor T3 is turned on according to the first scanning signal Sn received through the first scanning line 14 to connect the driving gate electrode G1 and the driving drain electrode D1 of the driving thin film transistor T1, thereby diode-connecting the driving thin film transistor T1.

The first initialization gate electrode G4 of the first initialization thin film transistor T4 is connected to the second scanning line 24. The first initialization drain electrode D4 of the first initialization thin film transistor T4 is connected to the initialization voltage line 22. The first initialization source electrode S4 of the first initialization thin film transistor T4 is also connected to the first electrode C1 of the storage capacitor Cst, the compensation drain electrode D3 of the compensation thin film transistor T3, and the driving gate electrode G1 of the driving thin film transistor T1. The first initialization thin film transistor T4 is turned on according to a second scanning signal Sn−1 received through the second scanning line 24 to transmit an initialization voltage VINT to the driving gate electrode G1 of the driving thin film transistor T1, thereby performing an initialization operation of initializing a voltage of the driving gate electrode G1 of the driving thin film transistor T1.

A first emission control gate electrode G5 of the first emission control thin film transistor T5 is connected to the emission control line 15. A first emission control source electrode S5 of the first emission control thin film transistor T5 is connected to the driving voltage line 26. A first emission control drain electrode D5 of the first emission control thin film transistor T5 is connected to the driving source electrode S1 of the driving thin film transistor T1 and the data transmission drain electrode D2 of the data transmission thin film transistor T2.

A second emission control gate electrode G6 of the second emission control thin film transistor T6 is connected to the emission control line 15. A second emission control source electrode S6 of the second emission control thin film transistor T6 is connected to the driving drain electrode D1 of the driving thin film transistor T1 and the compensation source electrode S3 of the compensation thin film transistor T3. The second emission control drain electrode D6 of the second emission control thin film transistor T6 is electrically connected to the anode electrode of the OLED. The first emission control thin film transistor T5 and the second emission control thin film transistor T6 are simultaneously turned on according to an emission control signal En received through the emission control line 15 so that a first power voltage ELVDD is transmitted to the OLED and a driving current Id flows through the OLED accordingly.

A second initialization gate electrode G7 of the second initialization thin film transistor T7 is connected to the third scanning line 34. A second initialization source electrode S7 of the second initialization thin film transistor T7 is connected to the anode electrode of the OLED. A second initialization drain electrode D7 of the second initialization thin film transistor T7 is connected to the initialization voltage line 22. The second initialization thin film transistor T7 is turned on according to a third scanning signal Sn+1 received through the third scanning line 34, thereby initializing the anode electrode of the OLED.

The second electrode C2 of the storage capacitor Cst is connected to the driving voltage line 26. The first electrode C1 of the storage capacitor Cst is connected to the driving gate electrode G1 of the driving thin film transistor T1, the compensation drain electrode D3 of the compensation thin film transistor T3, and the first initialization source electrode S4 of the first initialization thin film transistor T4.

A cathode electrode of the OLED is connected to a second power voltage ELVSS. The OLED receives a driving current Id from the driving thin film transistor T1 to emit light, thereby displaying an image.

Figure 3:
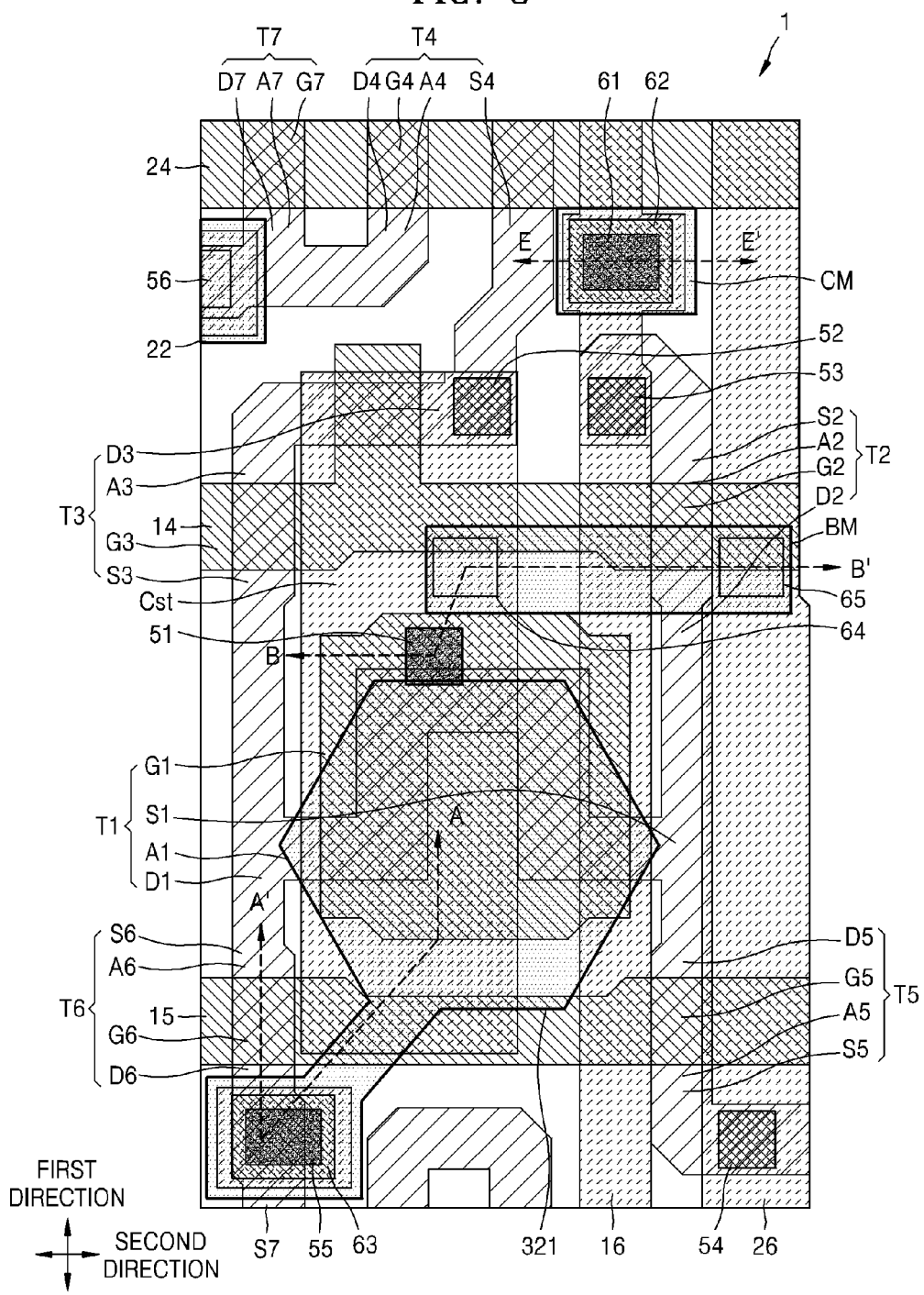
FIG. 3 is a schematic plan view of a pixel of an OLED display according to an embodiment.

FIG. 3 is a schematic plan view of the pixel 1 of the OLED display 1000 according to an embodiment.

Referring to FIG. 3, the pixel 1 includes the driving thin film transistor T1, the data transmission thin film transistor T2, the compensation thin film transistor T3, the first initialization thin film transistor T4, the first emission control thin film transistor T5, the second emission control thin film transistor T6, the second initialization thin film transistor T7, and the storage capacitor Cst.

The driving thin film transistor T1 includes a driving semiconductor layer A1, a driving gate electrode G1, a driving source electrode S1, and a driving drain electrode D1. The driving source electrode S1 corresponds to a driving source area that is doped with an impurity in the driving semiconductor layer A1 and the driving drain electrode D1 corresponds to a driving drain area doped with an impurity in the driving semiconductor layer A1. Meanwhile, in the driving semiconductor layer A1, an area between the driving source area and the driving drain electrode corresponds to a driving channel area. The driving gate electrode G1 is connected to the storage capacitor Cst, the compensation drain electrode D3 of the compensation thin film transistor T3, and the first initialization source electrode S4 of the first initialization thin film transistor T4. In detail, the driving gate electrode G1 is connected to the first electrode C1 (see FIG. 4) of the storage capacitor Cst through a first contact hole 51. The compensation drain electrode D3 and the first initialization source electrode S4 are connected to the first electrode C1 of the storage capacitor Cst through a second contact hole 52. Accordingly, the driving gate electrode G1 is connected to the compensation drain electrode D3 and the first initialization source electrode S4. That is, the first electrode C1 of the storage capacitor Cst connects the driving gate electrode G1 and the compensation drain electrode D3 and the driving gate electrode G1 and the first initialization source electrode S4. The storage capacitor Cst has a size that covers the first contact hole 51 and the second contact hole 52.

The driving channel area of the driving thin film transistor T1 is curved (or serpentine). By forming the curved driving channel area, a long driving channel area can be formed in a narrow space. As the length of the driving channel area formed in the driving thin film transistor T1 increases, the driving range of a gate voltage applied to the driving gate electrode G1 increases. Accordingly, by varying the magnitude of the driving gate voltage, the gradation of light emitted from the OLED can be precisely controlled. As a result, a resolution of the OLED display 1000 can be increased and the display quality thereof can be improved. The driving channel area of the driving thin film transistor T1 can have various curved shapes such as an S, M, or W shape.

The data transmission thin film transistor T2 includes a data transmission semiconductor layer A2, a data transmission gate electrode G2, a data transmission source electrode S2, and a data transmission drain electrode D2. The data transmission source electrode S2 corresponds to a switching source area that is doped with an impurity in the data transmission semiconductor layer A2 and the data transmission drain electrode D2 corresponds to a switching drain area doped with an impurity in the data transmission semiconductor layer A2. The data transmission source electrode S2 is connected to the data line 16 through a third contact hole 53. The data transmission drain electrode D2 is connected to the driving thin film transistor T1 and the first emission control thin film transistor T5. The data transmission gate electrode G2 is formed as a portion of the first scanning line 14.

The compensation thin film transistor T3 includes a compensation semiconductor layer A3, a compensation gate electrode G3, a compensation source electrode S3, and a compensation drain electrode D3. The compensation source electrode S3 corresponds to a compensation source area that is doped with an impurity in the compensation semiconductor layer A3, and the compensation drain electrode D3 corresponds to a compensation drain area doped with an impurity in the compensation semiconductor layer A3. The compensation gate electrode G3 includes a dual gate electrode that is formed of a portion of the first scanning line 14 and a portion of a wiring that is protruded and extended from the first scanning line 14, thereby preventing a leakage current.

The first initialization thin film transistor T4 includes a first initialization semiconductor layer A4, a first initialization gate electrode G4, a first initialization source electrode S4, and a first initialization drain electrode D4. The first initialization source electrode S4 corresponds to a first initialization source area doped with an impurity in the first initialization semiconductor layer A4 and the first initialization drain electrode D4 corresponds to a first initialization drain area doped with an impurity in the first initialization semiconductor layer A4. The first initialization drain electrode D4 is connected to the second initialization thin film transistor T7 and the first initialization source electrode S4 is connected to the driving gate electrode G1 through the first electrode C1 of the storage capacitor Cst that is formed in and on the first contact hole 51 and the second contact hole 52. The first initialization gate electrode G4 is formed as a portion of the second scanning line 24.

The first emission control thin film transistor T5 includes a first emission control semiconductor layer A5, a first emission control gate electrode G5, a first emission control source electrode S5, and a first emission control drain electrode D5. The first emission control source electrode S5 corresponds to a first emission control source area doped with an impurity in the first emission control semiconductor layer A5 and the first emission control drain electrode D5 corresponds to a first emission control drain area doped with an impurity in the first emission control semiconductor layer A5. The first emission control source electrode S5 is connected to the driving voltage line 26 through a fourth contact hole 54. The first emission control gate electrode G5 is formed as a portion of the emission control line 15.

The second emission control thin film transistor T6 includes a second emission control semiconductor layer A6, a second emission control gate electrode G6, a second emission control source electrode S6, and a second emission control drain electrode D6. The second emission control source electrode S6 corresponds to a second emission control source area doped with an impurity in the second emission control semiconductor layer A6 and the second emission control drain electrode D6 corresponds to a second emission control drain area doped with an impurity in the second emission control semiconductor layer A6. The second emission control drain electrode D6 is connected to the pixel electrode 321 of the OLED through a fifth contact hole 55 and a via hole VIA. The second emission control gate electrode G6 is formed as a portion of the emission control line 15.

The second initialization thin film transistor T7 includes a second initialization semiconductor layer A7, a second initialization gate electrode G7, a second initialization source electrode S7, and a second initialization drain electrode D7. The second initialization source electrode S7 corresponds to a second initialization source area doped with an impurity in the second initialization semiconductor layer A7 and the second initialization drain electrode D7 corresponds to a second initialization drain area doped with an impurity in the second initialization semiconductor layer A7. The second initialization drain electrode D7 is connected to the initialization voltage line 22 through a sixth contact hole 56 and the second initialization source electrode S7 is connected to the pixel electrode 321 of the OLED through the fifth contact hole 55 and the via hole VIA.

The first electrode C1 of the storage capacitor Cst (see FIG. 4) is directly connected to the driving gate electrode G1 and is connected to the first initialization thin film transistor T4 and the compensation thin film transistor T3 through the first contact hole 51 and the second contact hole 52. The first electrode C1 is formed to overlap the driving semiconductor layer A1. A second electrode C2 of the storage capacitor Cst (see FIG. 4) is formed to overlap with at least a portion of the first electrode C1. In some embodiments, the second electrode C2 has substantially the same area as that of the first electrode C1, but the embodiments of the described technology are not limited thereto. The area of the second electrode C2 may be greater than the area of the first electrode C1 or vice versa. The second electrode C2 of the storage capacitor Cst is connected to the driving voltage line 26 through a bridge metal BM.

The storage capacitor Cst is formed in a different layer from the driving gate electrode G1, and thus areas of the first electrode C1 and the second electrode C2 can be increased compared to when they are formed in the same layer. Accordingly, the storage capacitor Cst can be formed to have a sufficient capacitance.

The first scanning line 14, the second scanning line 24, and the emission control line 15 are all formed on the same layer and extend in a second direction. The data line 16 and the driving voltage line 26 are formed on the same layer as the storage capacitor Cst and extend in a first direction. A first via hole 61 is formed in a portion of the data line 16 and a second via hole 62 and a contact metal CM are formed above the first via hole 61.

The pixel electrode 321, the bridge metal BM, and the initialization voltage line 22 may all be formed on the same layer.

Figure 4:
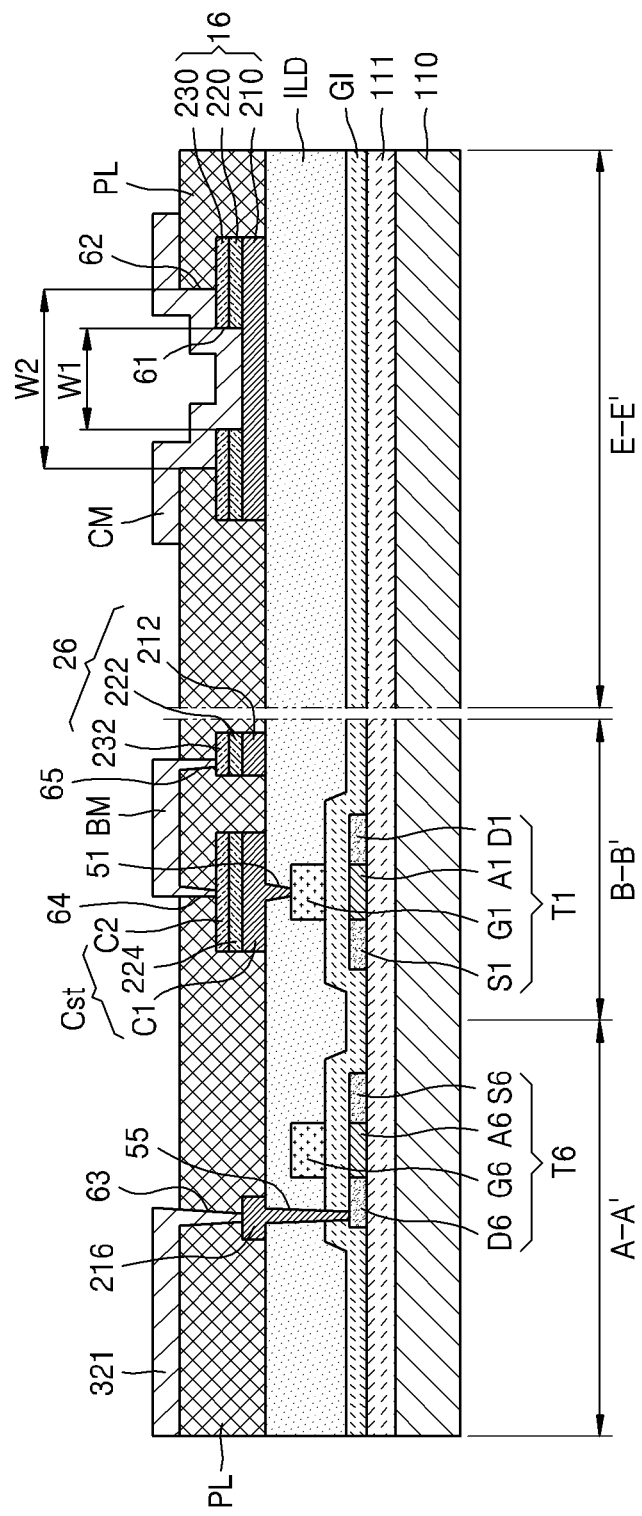
FIG. 4 is a cross-sectional view along line A-A', line B-B', and line E-E' of FIG. 3.

FIG. 4 is a cross-sectional view along line A-A', line B-B', and line E-E' of FIG. 3.

In FIG. 4, in order to clearly illustrate the features of the described technology, some wirings, some electrodes, and some semiconductor layers that are formed along cross-sections cut along a cutting line which are less relevant to partially illustrate the driving thin film transistor T1 or the storage capacitor Cst or the like are omitted. Thus, the illustration of FIG. 4 may be different from the actual cross-sectional views along line A-A', line B-B', and line E-E' of FIG. 3.

Referring to FIG. 4, the OLED display includes the driving thin film transistor T1, the switching thin film transistors T2 through T7, the storage capacitor Cst, the data line 16, the driving voltage line 26 or the like formed over the substrate 110.

In the present specification, a switching thin film transistor refers to the thin film transistors other than the driving thin film transistor T1, which mainly perform a switching operation. That is, the switching thin film transistor may correspond to the data transmission thin film transistor T2, the compensation thin film transistor T3, the first initialization thin film transistor T4, the first emission control thin film transistor T5, the second emission control thin film transistor T6, the second initialization thin film transistor T7 or the like. In FIG. 4, the second emission control thin film transistor T6 corresponds to the switching thin film transistor.

First, referring to the cross-section of FIG. 4 cut along line E-E', a portion of the data line 16 is illustrated. A data signal is transmitted to each pixel through the data line 16. The data line 16 includes a first data pattern layer 210, a data insulation layer 220, and a second data pattern layer 230 which are sequentially stacked. The first data pattern layer 210 and the second data pattern layer 230 are formed of a conductive material and the data insulation layer 220 is formed of an electrically insulating material. The data line 16 includes the first via hole 61 and the first and second data pattern layers 210 and 230 are connected to each other through the first via hole 61. That is, the contact metal CM is formed in the first via hole 61 so that the first data pattern layer 210 and the second data pattern layer 230 are electrically connected to each other. While the data line 16 is illustrated in FIG. 4 as an example, the above-described structure may also be applied to other wirings such as the driving voltage line 26.

That is, a wiring according to at least one embodiment has a structure in which a first conductive pattern layer, an intermediate insulation pattern layer, and a second conductive pattern layer are sequentially stacked. The wiring includes two conductive pattern layers, and thus has a relatively low resistance.

The wiring is formed on the same layer as the storage capacitor Cst, and in some embodiments, the first electrode C1, an intermediate layer 224, and the second electrode C2 of the storage capacitor Cst are respectively formed on the same layers as and of the same materials as those of the first conductive pattern layer, the intermediate insulation pattern layer, and the second conductive pattern layer of the wiring. In these embodiments, when the wiring is the data line 16, the first conductive pattern layer corresponds to the first data pattern layer 210, the intermediate insulation pattern layer corresponds to the data insulation layer 220, and the second conductive pattern layer corresponds to the second data pattern layer 230.

A planarization layer PL covering the data line 16 and the storage capacitor Cst is formed on the data line 16 and the storage capacitor Cst. The planarization layer PL includes the second via hole 62 formed at a position corresponding to the first via hole 61 and the contact metal CM is formed in the first via hole 61 and in the second via hole 62. The width w2 of the second via hole 62 may be greater than the width w1 of the first via hole 61. Accordingly, the contact metal CM contacts an upper surface of the second data pattern layer 230. The contact metal CM extends from inner portions of the first via hole 61 and the second via hole 62 to be formed on the planarization layer PL. The contact metal CM may be formed of the same material as that of the pixel electrode 321.

In some embodiments, the first via hole 61 exposes an upper surface of the first data pattern layer 210. However, the embodiments are not limited thereto. The first via hole 61 may be formed by etching a portion of the first pattern layer 210 and may expose an interlayer insulation layer ILD that is formed under the first data pattern layer 210.

Hereinafter, a structure of the OLED display according to the embodiments will be described in detail.

Referring to FIG. 4 again, the substrate 110 may be formed of a glass material that is transparent and includes $SiO_2$ as a main component. The substrate 110 is not limited thereto, and may be formed of various materials such as a ceramic material, a transparent plastic material, or a metal.

A buffer layer 111 is formed on the substrate 110. The buffer layer 111 prevents diffusion of impurity ions and penetration of water or an external air, and thus functions as a barrier layer that planarizes a surface of the substrate 110, and/or a blocking layer.

The driving semiconductor layer A1 of the driving thin film transistor T1 and the second emission control semiconductor layer A6 of the second emission control thin film transistor T6 are formed on the buffer layer 111. The driving semiconductor layer A1 and the second emission control semiconductor layer A6 may be formed of polysilicon and may include a channel area that is not doped with an impurity and a source area and a drain area that are formed on two sides of the channel area and doped with an impurity. The impurity may vary according to a type of a thin film transistor, and may be an N-type or P-type impurity. While not illustrated in FIG. 4, the data transmission semiconductor layer A2 of the data transmission thin film transistor T2, the compensation semiconductor layer A3 of the compensation thin film transistor T3, the first initialization semiconductor layer A4 of the first initialization thin film transistor T4, the second initialization semiconductor layer A7 of the second initialization thin film transistor T7, and the first emission control semiconductor layer A5 of the first emission control thin film transistor T5 may also be connected to the driving semiconductor layer A1 and the second emission control semiconductor layer A6 and may be simultaneously formed.

A gate insulation layer GI is stacked on the entire surface of the substrate 110 to cover the semiconductor layers A1 through A7. The gate insulation layer GI may have a single layer or a multilayer structure formed of an inorganic material such as a silicon oxide or a silicon nitride. The gate insulation layer GI electrically insulates the semiconductor layers and the gate electrodes G1 through G7 from each other.

The second emission control gate electrode G6 of the second emission control thin film transistor T6 and the driving gate electrode G1 of the driving thin film transistor T1 are formed on the gate insulation layer GI.

Also, while not illustrated in FIG. 4, the gate electrodes G1 through G7 of the thin film transistors T1 through T7, the first scanning line 14, the second scanning line 24, and the emission control line 15 may also be formed on the same layer as and of the same materials as those of the driving gate electrode G1 and the second emission control gate electrode G6.

The driving gate electrode G1 and the second emission control gate electrode G6 may be formed of at least one material from the following: molybdenum (Mo), aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), titanium (Ti), tungsten (W), and copper (Cu).

The interlayer insulation layer ILD is formed on the entire surface of the substrate 110 to cover the driving gate electrode G1 and the second emission control gate electrode G6.

The interlayer insulation layer ILD may be formed of an inorganic material or an organic material. In some embodiments, the interlayer insulation layer ILD is formed of an inorganic material. For example, the interlayer insulation layer ILD may be formed of a metal oxide or a metal nitride; in detail, examples of the inorganic material include: a silicon oxide ($SiO_2$), a silicon nitride ($SiN_x$), a silicon oxynitride (SiON), an aluminum oxide ($Al_2O_3$), a titanium oxide ($TiO_2$), a tantalum oxide ($Ta_2O_5$), a hafnium oxide ($HfO_2$), and a zinc oxide ($ZrO_2$).

The interlayer insulation layer ILD may have a multilayer or single-layer structure formed of an inorganic material such as a silicon oxide ($SiO_x$) and/or a silicon nitride ($SiN_x$).

In some embodiments, the interlayer insulation layer ILD has a double structure formed of $SiO_x/SiN_y$ or $SiN_x/SiO_y$.

In some embodiments, the interlayer insulation layer ILD is formed of an organic material. For example, the interlayer insulation layer ILD is formed of at least one material from the following: a polyacrylate resin, an epoxy resin, a phenolic resin, a polyamide resin, a polyimide resin, an unsaturated polyester resin, a polyphenylene ether resin, a polyphenylene sulfide resin, and benzocyclobutene (BCB).

The storage capacitor Cst, the data line 16, and the driving voltage line 26 are formed on the interlayer insulation layer ILD.

In some embodiments, the storage capacitor Cst overlaps the driving thin film transistor T1. The first electrode C1 of the storage capacitor Cst is connected to the driving gate electrode G1 through the first contact hole 51. In addition to overlapping the driving thin film transistor T1, the storage capacitor Cst is formed in a layer different from the gate electrodes G1 through G7 and the scanning lines 14, 24, and 34, so that sufficient areas for the first electrode C1 and the second electrode C2 can be secured. Accordingly, a sufficient storage capacity of the storage capacitor Cst can be secured.

The intermediate dielectric layer 224 is interposed between the first electrode C1 and the second electrode C2 of the storage capacitor Cst. The intermediate dielectric layer 224 may have a multilayer or single-layer structure formed of an inorganic material such as a silicon oxide ($SiO_x$) and/or a silicon nitride ($SiN_x$).

The data line 16 and/or the driving voltage line 26 are formed on the same layer as the storage capacitor Cst.

The data line 16 includes the first data pattern layer 210, the data insulation layer 220, and the second data pattern layer 230 that are sequentially stacked. The first data pattern layer 210 and the second data pattern layer 230 are formed of a conductive material, and the data insulation layer 220 is formed of an insulating material. The data line 16 includes the first via hole 61, and the first data pattern layer 210 and the second data pattern layer 230 connected to each other through the first via hole 61. The contact metal CM is formed in the first via hole 61 so that the first data pattern layer 210 and the second data pattern layer 230 are electrically connected to each other.

The driving voltage line 26 includes a first voltage pattern layer 212, a voltage insulation layer 222, and a second voltage pattern layer 232 that are sequentially stacked. The first voltage pattern layer 212 and the second voltage pattern layer 232 are formed of a conductive material, and the voltage insulation layer 222 is formed of an electrically insulating material. While not illustrated in the drawing, like the data line 16, the driving voltage line 26 includes a via hole so that the first voltage pattern layer 212 and the second voltage pattern layer 232 are electrically connected to each other.

In some embodiments, the first electrode C1, the first data pattern layer 210, and the first voltage pattern layer 212 are all formed on the same layer and of the same material. The first electrode C1, the first data pattern layer 210, and the first voltage pattern layer 212 may include at least one metal from the following: aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), titanium (Ti), tungsten (W), and copper (Cu). In some embodiments, the first electrode C1, the first data pattern layer 210, or the first voltage pattern layer 212 may have a stacked structure of Ti/Al/Ti, Mo/Al/Mo, Mo/AlGe/Mo, or Ti/Cu.

In some embodiments, the intermediate dielectric layer 224, the data insulation layer 220, and the voltage insulation layer 222 are all formed on the same layer and of the same material. The intermediate dielectric layer 224, the data insulation layer 220, or the voltage insulation layer 222 may have a single-layer or multilayer structure formed of an inorganic material, an organic material or an organic-inorganic complex material. In some embodiments, the intermediate dielectric layer 224, the data insulation layer 220, or the voltage insulation layer 222 may be formed of a silicon oxide (SiOx), a silicon nitride (SiNx) or a stacked structure including these materials.

In some embodiments, the second electrode C2, the second data pattern layer 230, and the second voltage pattern layer 232 are all formed on the same layer and of the same material. The second electrode C2, the second data pattern layer 230, and the second voltage pattern layer 232 may include at least one metal from the following: aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), titanium (Ti), tungsten (W), and copper (Cu). In some embodiments, the second electrode C2, the second data pattern layer 230, or the second voltage pattern layer 232 may a stacked structure of Ti/Al/Ti, Mo/Al/Mo, Mo/AlGe/Mo, or Ti/Cu.

A planarization layer PL is formed on the entire surface of the substrate 110 to cover the storage capacitor Cst, the driving voltage line 26, and the data line 16. The pixel electrode 321, the bridge metal BM, and the contact metal CM are formed on the planarization layer PL.

The pixel electrode 321 is connected to the second emission control drain electrode D6 through the third via hole 63 and the fifth contact hole 55. That is, a pixel electrode contact metal 261 is formed in the fifth contact hole 55 and a portion of the pixel electrode 321 is filled in the third via hole 63, so that the pixel electrode 321 and the second emission control drain electrode D6 are connected to each other.

The bridge metal BM is connected to the second electrode C2 of the storage capacitor Cst through a fourth via hole 64 and is connected to the second voltage pattern layer 232 of the driving voltage line 26 through the fifth via hole 65.

The contact metal CM is a member that electrically connects the first data pattern layer 210 and the second data pattern layer 230 of the data line 16 and extends from the first via hole 61 and the second via hole 62 to be formed on the planarization layer PL. The contact metal CM is in contact with the upper surface of the first data pattern layer 210 through the first via hole 61 and is in contact with a lateral surface and the upper surface of the second data pattern layer 230 through the second via hole 62.

The planarization layer PL may be formed of an insulation material. For example, the planarization layer PL may have a single-layer or multilayer structure formed of an inorganic material, an organic material, or an organic-inorganic complex material and by using various deposition methods. In some embodiments, the planarization layer PL may be formed of at least one material from the following: a polyacrylate resin, an epoxy resin, a phenolic resin, a polyamide resin, a polyimide resin, an unsaturated polyester resin, a polyphenylene ether resin, a polyphenylene sulfide resin, and benzocyclobutene (BCB).

In some embodiments, the pixel electrode 321, the bridge metal BM, and the contact metal CM are formed on the same layer and are all formed of the same material. The pixel electrode 321, the bridge metal BM or the contact metal CM may include at least one conductive material from the following: ITO, IZO, ZnO, In$_2$O$_3$, Ag, Mg, Al, Pt, Pd, Au, Ni, Nd, Ir, and Cr. In some embodiments, the pixel electrode 321, the bridge metal BM or the contact metal CM have a stacked structure of ITO/Ag/ITO.

As described above, according to the OLED display according to at least one embodiment, the storage capacitor Cst is formed in a different layer from the driving thin film transistor T1 and overlaps the driving thin film transistor T1. Accordingly, a sufficient capacitance of the storage capacitor Cst can be secured.

In addition, the wiring included in each pixel of the OLED display according to at least one embodiment, has a stacked structure including the first conductive pattern layer, the intermediate insulation pattern layer, and the second conductive pattern layer, and thus, the wiring has a low resistance.

FIGS. 5A through 5E are cross-sectional views sequentially illustrating a method of manufacturing an OLED display according to embodiments.

Figure 5A:
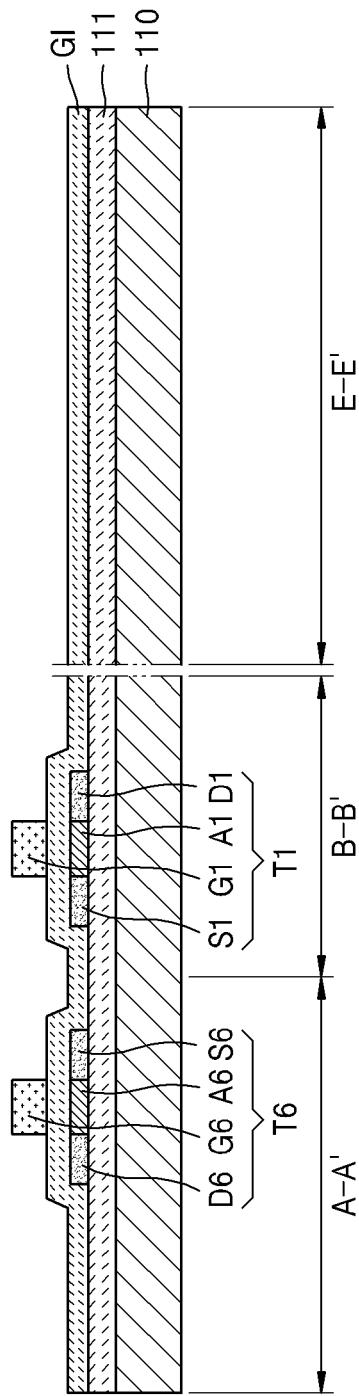
FIGS. 5A through 5E are cross-sectional views sequentially illustrating a method of manufacturing an OLED display according to embodiments.

Referring to FIG. 5A, a plurality of thin film transistors T1 through T7 are formed on a substrate 110.

First, semiconductor layers A1 through A7 of the thin film transistors T1 through T7 are formed and then a gate insulation layer GI is formed on the semiconductor layers A1 through A7.

The semiconductor layers A1 through A7 may be formed of a semiconductor including an amorphous silicon or a crystalline silicon and may be formed by using various deposition methods. The crystalline silicon may be formed by crystallizing an amorphous silicon. Examples of methods of crystallizing an amorphous silicon include a rapid thermal annealing (RTA) method, a solid phase crystallization (SPC) method, an Excimer laser annealing (ELA) method, a metal induced crystallization (MIC) method, a metal induced lateral crystallization (MILC) method, and a sequential lateral solidification (SLS) method. The semiconductor layers A1 through A7 may be patterned by using a photolithography method.

The gate insulation layer GI insulates the semiconductor layers A1 through A7 from gate electrodes G1 through G7 which are to be respectively formed on the semiconductor layers A1 through A7 and is formed on the entire surface of the substrate 110 while covering the semiconductor layers A1 through A7. The gate insulation layer GI may be formed of an organic or inorganic insulator. In some embodiments, the gate insulation layer GI may be formed of a silicon nitride layer (SiNx), a silicon oxide layer (SiO$_2$), a hafnium (Hf) oxide, an aluminum oxide or the like. The gate insulation layer GI may be formed using various deposition methods such as sputtering, a chemical vapor deposition (CVD) method or a plasma enhanced CVD (PECVD) method.

Next, the gate electrodes G1 through G7 are formed on the gate insulation layer GI such that at least a portion of the gate electrodes G1 through G7 overlaps with the semiconductor layers A1 through A7. Also, at the same time with the gate electrodes G1 through G7, for example, the first through third scanning lines 14, 24, and 34 and the emission control line 15 may be formed.

The gate electrodes G1 through G7 may be formed of at least one metal from the following: molybdenum (Mo), aluminum (Al), platinum (Pt), palladium (Pd), silver Ag), magnesium (Mg), gold (Au), nickel (Ni), neodymium (Nd), iridium (Ir), chromium (Cr), lithium (Li), calcium (Ca), titanium (Ti), tungsten (W), and copper (Cu).

Next, by using the gate electrodes G1 through G7 as a mask, impurities are injected into two ends of the semiconductor layers A1 through A7 to form source electrodes S1 through S7 and drain electrodes D1 through D7. If a trivalent dopant such as boron (B) is added as an impurity, the source electrodes S1 through S7 and drain electrodes D1 through D7 have a p-type conductivity and if a pentavalent dopant such as phosphor (P), arsenic (As), or antimony (Sb) is added as an impurity, source electrodes S1 through S7 and drain electrodes D1 through D7 have an n-type conductivity.

Figure 5B:
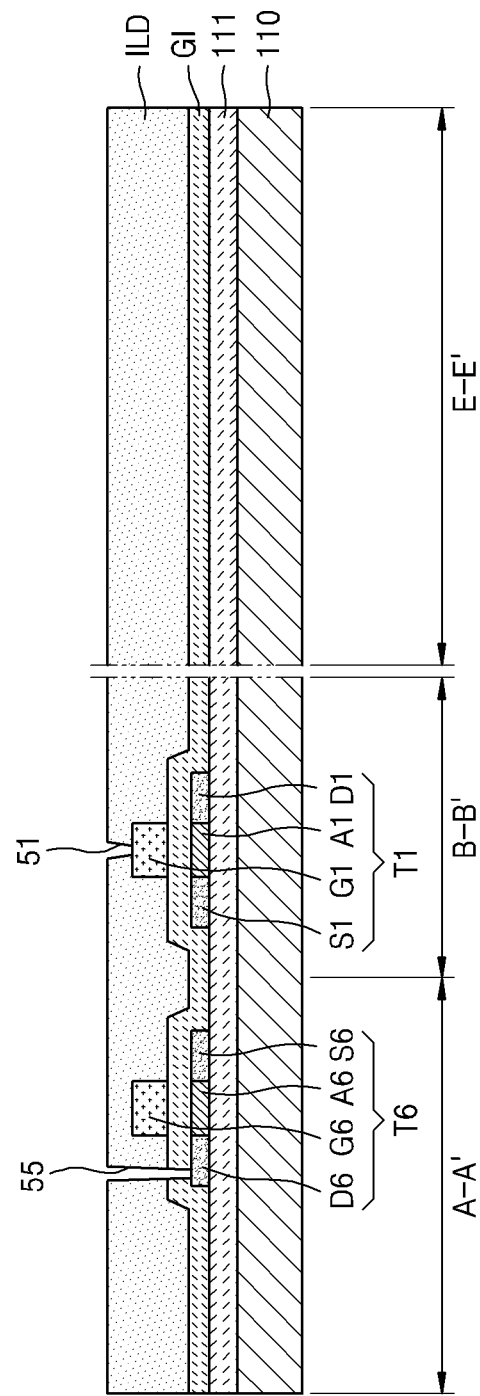

Referring to FIG. 5B, an interlayer insulation layer ILD is formed on the entire surface of the substrate 110 to cover the gate electrodes G1 through G7.

The interlayer insulation layer ILD may be formed of a single-layer or multilayer stacked structure of an organic material and an inorganic material. In some embodiments, the interlayer insulation layer ILD is formed of a silicon nitride layer (SiNx), a silicon oxide layer ($SiO_2$), a hafnium oxide, or an aluminum oxide. In some embodiments, the interlayer insulation layer ILD has a double structure formed of SiNx/SiOy or SiOy/SiNx. The interlayer insulation layer ILD may be formed using various deposition methods such as sputtering, a CVD method or a PECVD method.

Next, first through sixth contact holes 51 through 56 that pass through the interlayer insulation layer ILD are formed. The first through sixth contact holes 51 through 56 may be formed by using a patterning operation using a mask and an etching operation. The etching operation may be performed by a wet etching operation, a dry etching operation, or various etching operations based on a combination of these operations.

The first contact hole 51 exposes the driving gate electrode G1. The fifth contact hole 55 passes through to the gate insulation layer G1 to expose the second emission control drain electrode D6.

Figure 5C:
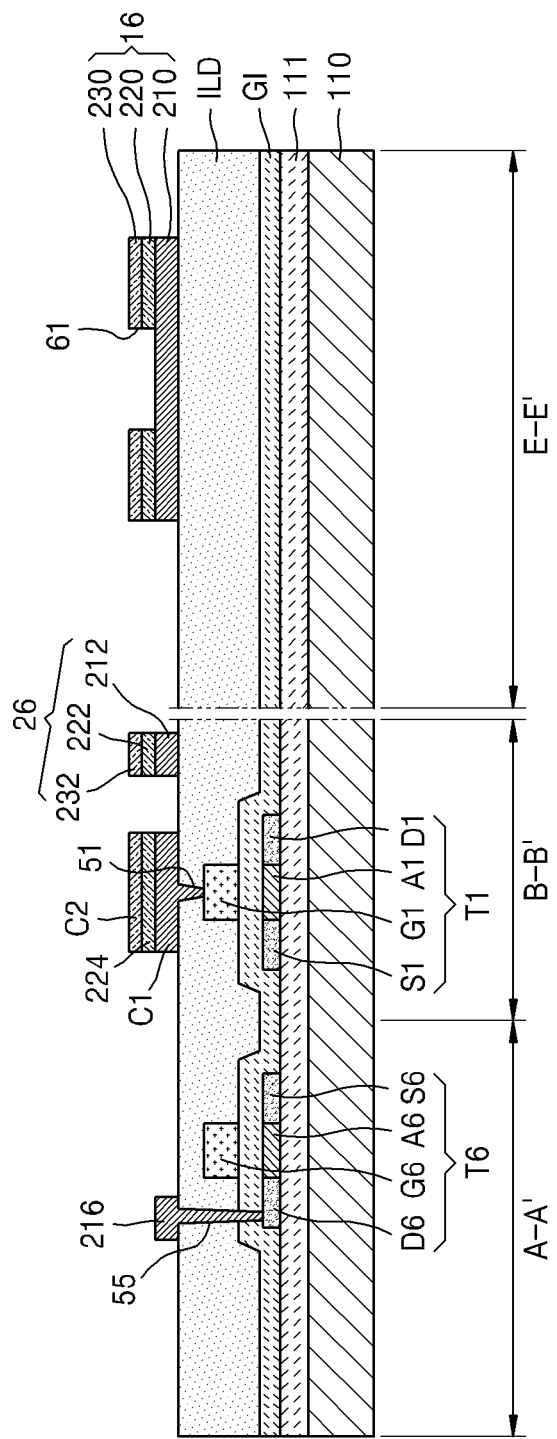

Referring to FIG. 5C, a storage capacitor Cst, a driving voltage line 26, and a data line 16 are simultaneously formed.

First, a first conductive layer, an intermediate insulation layer, and a second conductive layer (not shown) are sequentially stacked. The first conductive layer and the second conductive layer may include at least one metal from the following: aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), titanium (Ti), tungsten (W), and copper (Cu), and may have a single-layer structure or a multilayer structure.

The intermediate insulation layer may be formed of a silicon oxide layer (SiOx), a silicon nitride layer (SiNx) or a combination of these, and may have a single-layer structure or a multilayer structure.

The first conductive layer, the intermediate insulation layer, and the second conductive layer may be deposited by using various deposition methods such as sputtering, a CVD method or a PECVD method.

Next, the first conductive layer, the intermediate insulation layer, and the second conductive layer are patterned by using a half-tone mask operation.

Through the half-tone mask operation, the first conductive layer is patterned to a first electrode C1, a first voltage pattern layer 212, a first data pattern layer 210, and a pixel electrode contact metal 216. Also, the intermediate insulation layer is patterned to an intermediate dielectric layer 224, an intermediate voltage insulation layer 222, and an intermediate data insulation layer 220, and the second conductive layer is patterned to a second electrode C2, a second voltage pattern layer 232, and a second data pattern layer 230.

Meanwhile, in the half-tone mask operation, a thickness of a portion of a photoresist where the pixel electrode contact metal 216 and the first via hole 61 are to be formed is set to be smaller than a thickness of a portion of the photoresist where the storage capacitor Cst is to be formed and then the portion of the photoresist corresponding to the pixel electrode contact metal 216 and the first via hole 61 is etched, thereby removing the intermediate insulation layer formed on the pixel electrode contact metal 216 and in the first via hole 61 and the second conductive layer. According to this operation, the pixel electrode contact metal 216 and the first via hole 61 may be formed.

Figure 5D:
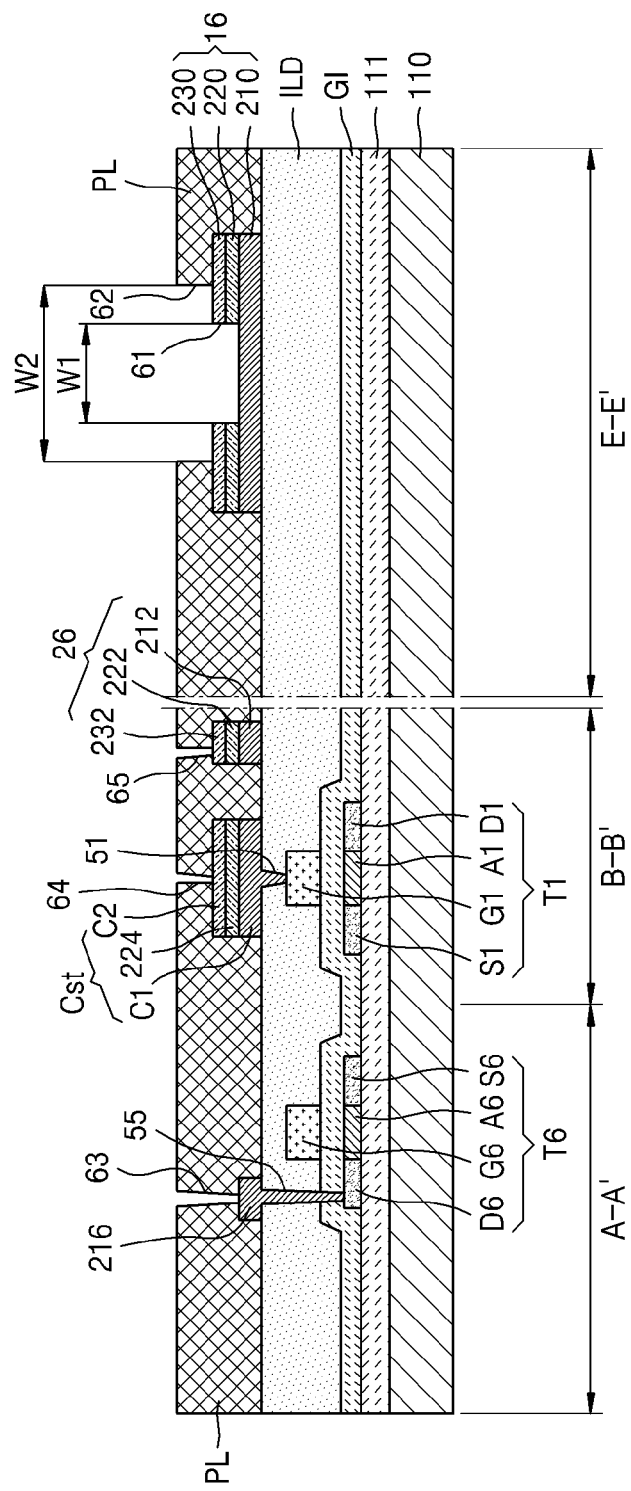

Referring to FIG. 5D, a planarization layer PL is formed to cover the storage capacitor Cst, the driving voltage line 26, and the data line 16.

The planarization layer PL may have a single-layer structure formed of an organic material or an inorganic material or multilayer structure including these materials. In some embodiments, the planarization layer PL is formed of at least one material from the following: a polyacrylate resin, an epoxy resin, a phenolic resin, a polyamide resin, a polyimide resin, an unsaturated polyester resin, a polyphenylene ether resin, a polyphenylene sulfide resin, and benzocyclobutene (BCB).

The planarization layer PL may be formed, according to a material thereof, by using, for example, a spin coating operation, a printing operation, a sputtering operation, a CVD method, an atomic layer deposition (ALD) method, a PECVD method, a high-precision plasma-CVD method, or a vacuum deposition method.

Next, second through fifth via holes 62 through 65 that pass through the planarization layer PL are formed. The second through fifth via holes 62 through 65 may be formed by using a patterning operation using a mask and an etching operation. The etching operation may be performed by a wet etching operation, a dry etching operation, or various etching operations based on a combination of these operations.

The second via hole 62 is formed at a position corresponding to a position of the first via hole 61. In some embodiments, the width w2 of the second via hole 62 is greater than the width w1 of the first via hole 61. Accordingly, the second via hole 62 exposes an upper surface of the second data pattern layer 230.

The third via hole 63 exposes an upper surface of the pixel electrode contact metal 216. The fourth via hole 64 exposes an upper surface of the second electrode C2, and the fifth via hole 65 exposes the second voltage pattern layer 232.

Figure 5E:
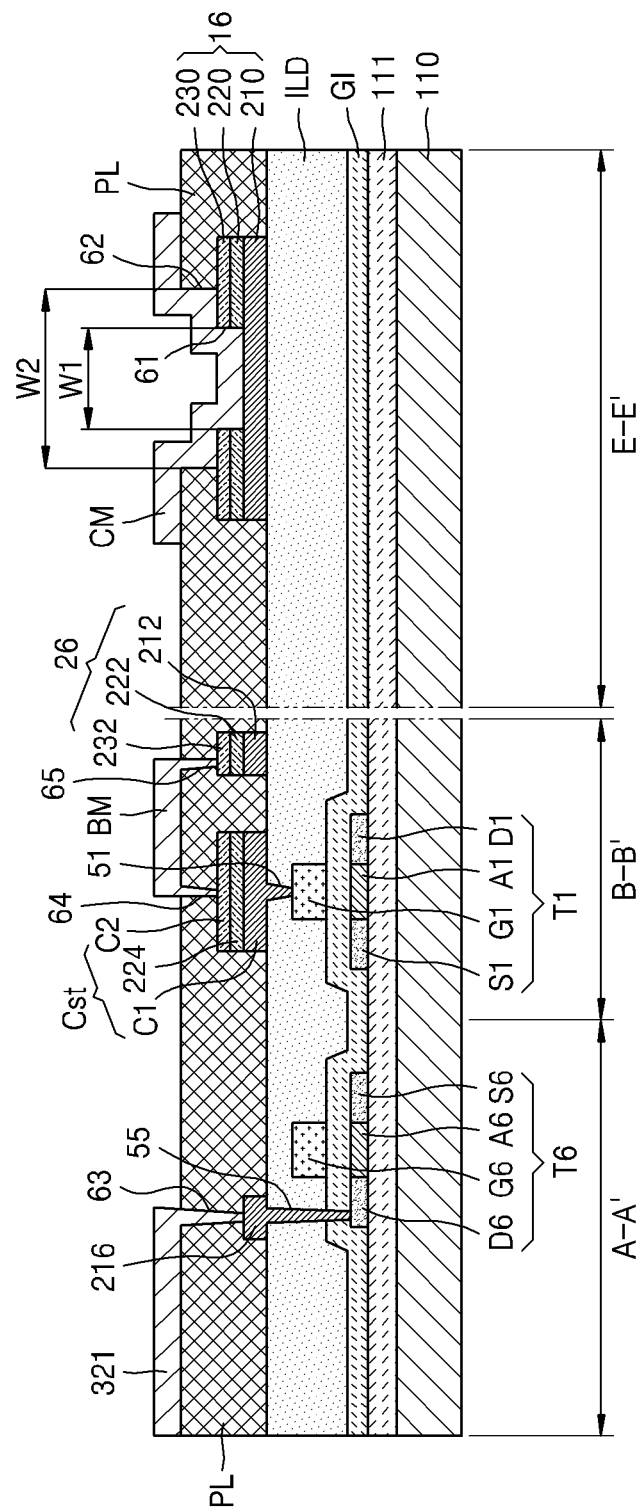

Referring to FIG. 5E, a pixel electrode 321, a bridge metal BM, and a contact metal CM are formed on the planarization layer PL.

A preliminary conductive layer (not shown) is deposited and then the preliminary conductive layer is patterned by using a mask operation to form the pixel electrode 321, the bridge metal BM, and the contact metal CM. The preliminary conductive layer may include at least one conductive material from the following: ITO, IZO, ZnO, $In_2O_3$, Ag, Mg, Al, Pt, Pd, Au, Ni, Nd, Ir, and Cr. In some embodiments, the preliminary conductive layer has a stacked structure of ITO/Ag/ITO.

The pixel electrode 321 is formed by filling the third via hole 63 and is connected to the pixel electrode contact metal 216. The bridge metal BM is formed by filing the fourth via hole 64 and the fifth via hole 65 and is connected to the driving voltage line 26 and the storage capacitor Cst. The contact metal CM is formed by filling the first via hole 61 and the second via hole 62 and is connected to the first data pattern layer 210 and the second data pattern layer 230 of the data line 16. Accordingly, a wiring according to at least one embodiment such as the data line 16 has a low resistance.

Figure 6:
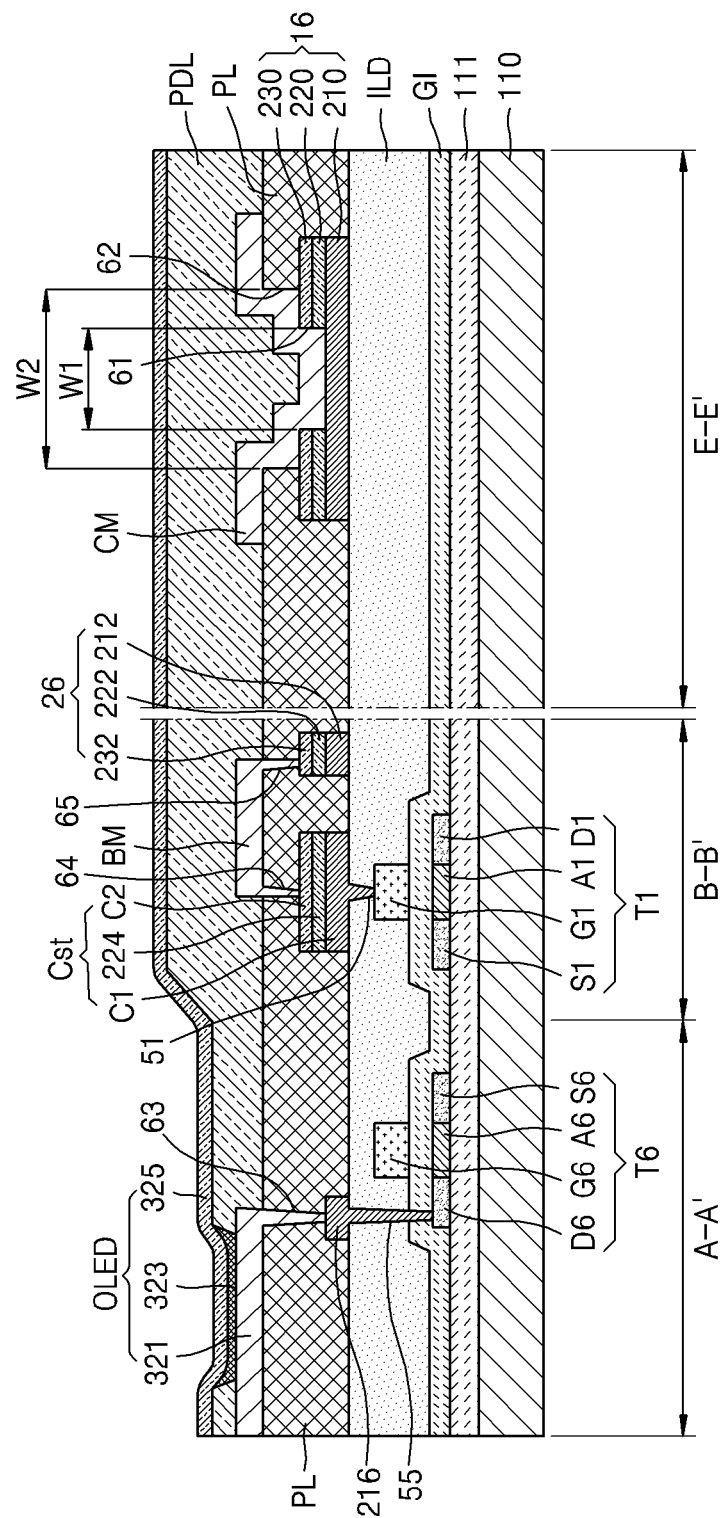
FIG. 6 is a schematic cross-sectional view of an OLED display according to an embodiment.

FIG. 6 is a schematic cross-sectional view of an OLED display according to an embodiment. In FIG. 6, like reference numerals as those in FIG. 4 denote like elements and repeated description thereof will be omitted for simplification of description.

The OLED display of FIG. 6 includes a driving thin film transistor T1, switching thin film transistors T2 through T7, a storage capacitor Cst, wirings such as a data line 16 and a driving voltage line 26, a pixel defining layer PDL, and an OLED, which are formed on a substrate 110.

The wirings according to at least one embodiment have a stacked structure in which a first conductive pattern layer, an intermediate insulation pattern layer, and a second conductive pattern layer are sequentially stacked. The wirings include double conductive pattern layers, and thus have a low resistance.

In some embodiments, the wirings are formed on the same layer as the storage capacitor Cst and the first electrode C1, the intermediate dielectric layer 224, and the second electrode C2 of the storage capacitor Cst are respectively formed on the same layers as and of the same materials as those of the first conductive pattern layer, the intermediate insulation pattern layer, and the second conductive pattern layer of the wiring. In these embodiments, when the wiring is the data line 16, the first conductive pattern layer corresponds to the first data pattern layer 210, the intermediate insulation pattern layer corresponds to the data insulation layer 220, and the second conductive pattern layer corresponds to the second data pattern layer 230.

A planarization layer PL covering the data line 16 and the storage capacitor Cst is formed on the data line 16 and the storage capacitor Cst. The planarization layer PL includes a second via hole 62 that is formed at a position corresponding to the first via hole 61 and the contact metal CM is formed in the first via hole 61 and the second via hole 62. In the FIG. 6 embodiment, the width w2 of the second via hole 62 is greater than the width w1 of the first via hole 61. Accordingly, the contact metal CM contacts an upper surface of the second data pattern layer 230. The contact metal CM extends from inner portions of the first via hole 61 and the second via hole 62 to be formed on the planarization layer PL. The planarization layer PL may be formed of the same material as that of the pixel electrode 321.

In some embodiments, the first via hole 61 exposes an upper surface of the first data pattern layer 210. However, the embodiments are not limited thereto. The first via hole 61 may be formed by etching a portion of the first data pattern layer 210 and expose the interlayer insulation layer ILD formed under the first data pattern layer 210.

The pixel defining layer PDL defines a pixel area and a non-pixel area. The pixel defining layer PDL includes an opening that exposes the pixel electrode 321 and is formed to cover the entire surface of the substrate 110. An intermediate layer 323, which is to be described later, is formed in the opening, and thus, the opening defines the substantial pixel area.

The pixel electrode 321, the intermediate layer 323, and an opposite electrode 325 form the OLED. Holes and electrons injected into the pixel electrode 321 and the opposite electrode 325 of the OLED combine in an organic emission layer to thereby emit light.

The intermediate layer 323 may include an organic emission layer. Alternatively, the intermediate layer 323 may include an organic emission layer, and may further include at least one of a hole injection layer (HIL), a hole transport layer (HTL), an electron transport layer (ETL), and an electron injection layer (EIL). The current embodiment is not limited thereto, and the intermediate layer 323 may include an organic emission layer and also other various functional layers.

The opposite electrode 325 is formed on the intermediate layer 323. The opposite electrode 325 forms an electrical field with the pixel electrode 321 so that light is emitted from the intermediate layer 323. The pixel electrode 321 may be patterned in each pixel and the opposite electrode 325 may be formed such that a common voltage is applied to all pixels.

The pixel electrode 321 and the opposite electrode 325 may be included as a transparent electrode or a reflective electrode. The pixel electrode 321 may function as an anode electrode and the opposite electrode 325 may function as a cathode electrode, but are not limited thereto. For example, the pixel electrode 321 may function as a cathode electrode and the opposite electrode 325 may function as an anode electrode. The opposite electrode 325 may include at least one conductive material from the following: ITO, IZO, ZnO, $In_2O_3$, Ag, Mg, Al, Pt, Pd, Au, Ni, Nd, Ir, and Cr.

While one OLED is illustrated in the drawings, a display panel may include a plurality of OLEDs. A pixel may be formed in each OLED and red, green, blue or white colors may be respectively realized by the pixels.

However, the embodiments are not limited thereto. The intermediate layer 323 may also be commonly formed over all of the pixel electrodes 321 regardless of positions of the pixel. An organic emission layer may be formed by vertically stacking layers including light-emitting materials that emit, for example, red, green or blue color light or by mixing the light-emitting materials. When white light is emitted, other color combinations are also possible. Also, a color conversion layer or a color filter that converts the emitted white light into a predetermined color may be further included.

A protection layer (not shown) may be formed on the opposite electrode 325 and may cover the OLED to protect the same. The protection layer may be formed of an inorganic insulation layer and/or an organic insulation layer. Also, the OLED display may further include an encapsulation member (not shown) that protects the plurality of pixels.

As described above, according to at least one embodiment, the OLED display includes low-resistance wirings, and thus, the OLED display has improved display characteristics.

Also, according to at least one embodiment, the OLED display has a sufficient storage capacity in the storage capacitor.

In addition, the low-resistance wiring and the storage capacitor can be formed at the same time, and thus manufacturing costs can be reduced.

It should be understood that the exemplary embodiments described herein should be considered in a descriptive sense only and not for purposes of limitation. Descriptions of features or aspects within each embodiment should typically be considered as available for other similar features or aspects in other embodiments.

While one or more embodiments of the inventive technology have been described with reference to the figures, it will be understood by those of ordinary skill in the art that various changes in form and details may be made therein without departing from the spirit and scope of the invention as defined by the following claims.

What is claimed is:

1. An organic light-emitting diode (OLED) display comprising a plurality of pixels, wherein each of the pixels comprises:
   at least one wiring configured to receive an electrical signal; and
   a storage capacitor formed on the same layer as the wiring,
   wherein the wiring comprises a first conductive pattern layer, an intermediate insulation pattern layer, and a second conductive pattern layer that are sequentially stacked,
   wherein a first via hole is defined in the second conductive pattern layer and the intermediate insulation pattern layer, and
   wherein the first and second conductive pattern layers are electrically connected to each other through the first via hole.

2. The OLED display of claim 1, wherein each of the pixels further comprises:
   a planarization layer covering the wiring and the storage capacitor, wherein a second via hole is formed in the planarization layer at a position corresponding to the first via hole; and
   a contact metal formed in the first and second via holes.

3. The OLED display of claim 2, wherein each of the pixels further comprises:
   an OLED formed over the planarization layer and comprising: i) a pixel electrode, ii) an intermediate layer, and iii) an opposite electrode that are sequentially stacked,
   wherein the contact metal and the pixel electrode are formed of the same material.

4. The OLED display of claim 2, wherein the contact metal extends from the first via hole to the second via hole and is formed over the planarization layer.

5. The OLED display of claim 2, wherein the width of the second via hole is greater than the width of the first via hole.

6. The OLED display of claim 1, wherein the first via hole exposes an upper surface of the first conductive pattern layer.

7. The OLED display of claim 1, wherein each of the storage capacitors comprises a first electrode, an intermediate dielectric layer, and a second electrode that are sequentially stacked, wherein the first electrode, the intermediate dielectric layer, and the second electrode are respectively formed on the same layers as and of the same materials as those of the first conductive pattern layer, the intermediate insulation pattern layer, and the second conductive pattern layer.

8. The OLED display of claim 1, wherein each of the pixels further comprises:
   a driving thin film transistor formed below the storage capacitor and electrically connected to the storage capacitor through a contact hole; and
   an interlayer insulation layer interposed between the driving thin film transistor and the storage capacitor,
   wherein the storage capacitor overlaps the driving thin film transistor.

9. The OLED display of claim 8, wherein each of the driving thin film transistors comprises:
   a driving semiconductor layer formed over a substrate;
   a gate insulation layer covering the driving semiconductor layer; and
   a driving gate electrode formed over the gate insulation layer, wherein at least a portion of the driving gate electrode overlaps the driving semiconductor layer.

10. The OLED display of claim 1, wherein the at least one wiring comprises:
    a driving voltage line configured to receive a driving voltage; and
    a data line configured to receive a data signal,
    wherein each of the pixels further comprises:
       a planarization layer covering the driving voltage line, the data line, and the storage capacitor; and
       a bridge metal formed over the planarization layer and electrically connecting the driving voltage line to the storage capacitor.

* * * * *